United States Patent
Zhou

(10) Patent No.: US 10,205,134 B2
(45) Date of Patent: Feb. 12, 2019

(54) PACKAGING METHOD AND DISPLAY DEVICE

(71) Applicant: BOE TECHNOLOGY GROUP CO., LTD., Beijing (CN)

(72) Inventor: Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/690,943

(22) Filed: Aug. 30, 2017

(65) Prior Publication Data

US 2017/0365823 A1    Dec. 21, 2017

Related U.S. Application Data

(63) Continuation of application No. 14/073,458, filed on Nov. 6, 2013, now Pat. No. 9,831,470.

(30) Foreign Application Priority Data

Nov. 9, 2012  (CN) .......................... 2012 1 0449185

(51) Int. Cl.
*B29C 65/00*    (2006.01)
*B32B 37/00*    (2006.01)
(Continued)

(52) U.S. Cl.
CPC .......... *H01L 51/56* (2013.01); *H01L 51/5246* (2013.01); *B29C 65/485* (2013.01);
(Continued)

(58) Field of Classification Search
CPC ...... H01L 51/5246; H05B 33/04; H01J 9/261; B32B 2457/20; B32B 2457/206;
(Continued)

(56) References Cited

U.S. PATENT DOCUMENTS

2007/0290615 A1    12/2007  Kim
2011/0127314 A1    6/2011   Heinrich et al.
(Continued)

FOREIGN PATENT DOCUMENTS

CN     102062971 A    5/2011
CN     102701591 A    10/2012
(Continued)

OTHER PUBLICATIONS

USPTO RR dated Apr. 21, 2016 in connection with U.S. Appl. No. 14/073,458.
(Continued)

*Primary Examiner* — Philip C Tucker
*Assistant Examiner* — Brian R Slawski
(74) *Attorney, Agent, or Firm* — Ladas & Parry LLP

(57) ABSTRACT

A packaging method and a display device are disclosed. The packaging method includes: packaging a display element on a substrate having the display element disposed thereon to form a package covering the display element, wherein a first substance is disposed on at least a part of the substrate inside the package, the first substance including thermite; and initiating the first substance to obtain a second substance including a product of the thermite reaction.

17 Claims, 4 Drawing Sheets

(51) Int. Cl.
  *B32B 38/04* (2006.01)
  *B32B 17/10* (2006.01)
  *B32B 38/00* (2006.01)
  *H02K 13/04* (2006.01)
  *C04B 37/00* (2006.01)
  *H01L 23/12* (2006.01)
  *H01L 21/00* (2006.01)
  *H01L 51/56* (2006.01)
  *H01L 51/52* (2006.01)
  *B29C 65/48* (2006.01)
  *B32B 37/12* (2006.01)

(52) U.S. Cl.
  CPC .......... *B29C 65/486* (2013.01); *B29C 65/489* (2013.01); *B32B 2037/1238* (2013.01); *B32B 2457/20* (2013.01); *Y10T 156/10* (2015.01); *Y10T 428/239* (2015.01)

(58) Field of Classification Search
  CPC ............ B32B 37/1207; B32B 37/1238; Y10T 156/10; Y10T 428/239; B29C 65/48; B29C 65/483; B29C 65/4835; B29C 65/485; B29C 65/486; B29C 65/4865; B29C 65/4885; B29C 65/489
  USPC ... 156/60, 272.2, 272.8, 283, 284, 290, 291, 156/292, 295, 297, 298, 325; 257/E33.056, E33.058, E33.059, 701, 257/702, 704; 438/25, 26
  See application file for complete search history.

(56) References Cited

U.S. PATENT DOCUMENTS

2012/0256170 A1\* 10/2012 Philippens .............. H01L 51/56
  257/40
2013/0029075 A1 1/2013 Niiyama et al.

FOREIGN PATENT DOCUMENTS

WO 2011-012420 A1 2/2011
WO WO-2011012420 A1 \* 2/2011 ............ H01L 51/56
WO 2011-148990 A1 12/2011

OTHER PUBLICATIONS

USPTO NFOA dated Nov. 9, 2016 in connection with U.S. Appl. No. 14/073,458.
USPTO FOA dated Mar. 17, 2017 in connection with U.S. Appl. No. 14/073,458.
USPTO AA dated May 26, 2017 in connection with U.S. Appl. No. 14/073,458.
USPTO NOA dated Jul. 14, 2017 in connection with U.S. Appl. No. 14/073,458.
USPTO NOA dated Aug. 7, 2017 in connection with U.S. Appl. No. 14/073,458.
Extended European Search Report dated Sep. 29, 2017; Appln. 13191739.9.

\* cited by examiner

PACKAGING METHOD AND DISPLAY DEVICE

The present application is a continuation application for the same invention claimed in the prior nonprovisional application Ser. No. 14/073,458 now U.S. Pat. No. 9,831,470, titled of "PACKAGING METHOD AND DISPLAY DEVICE."

FIELD OF THE ART

Embodiments of the invention relate to the field of display technologies, more particularly, to a packaging method and a display device.

BACKGROUND

The Organic Light Emitting Display (OLED) technology, the Electrophoretic Display (EPD) technology and the Organic Photovoltage (OPV) technology all experienced rapid development over the past decade, and both the size of the screen and the display quality are improved significantly.

All the above technologies realize display by using organic and metal materials, which are quite sensitive to oxygen and water vapor. Oxygen and water vapor leaked into the display device will decrease the lifetime of the display device. Therefore, a package isolating oxygen and water vapor is of much importance for the OLED, EPD, OPV technologies.

Currently, the mainstream packages include coating package, thin-film package and so on. With coating package, several layers of organic or inorganic materials are coated or deposited on a display element. As for thin-film package, a thin-film that may effectively isolate oxygen and water vapor is attached to the display element. Lid-like package is one kind of thin-film package, in which the display element is placed in a hermetic space so as to isolate oxygen and water vapor. A final display device is obtained after being packaged with the above methods. However, whatever the package may be, it can only protect the upper part of the display element, while the effect on the interface where the package material bonds to the substrate is quite small, making it easy for oxygen and water vapor to pass and causing device failure. For example, as illustrated in FIG. 1, a display element 20 and a package 30 are disposed on a substrate 10. Oxygen and water vapor 40 may easily get into the display device 01 from a side of the display device 01, therefore easily reaching the display element 20 and causing erosion to the organic and metal materials in the display element 20 and failing the display element 20.

SUMMARY

An embodiment of the invention provides a packaging method and a display device, which can prolong the time needed for oxygen and water vapor to reach a display element, thereby increasing the lifetime of the display device.

In one aspect, the invention provides a packaging method comprising:

packaging a display element on a substrate having the display element disposed thereon to form a package covering the display element, wherein a first substance is disposed on at least a part of the substrate inside the package, the first substance comprising thermite; and initiating the first substance to obtain a second substance comprising a product of the thermite reaction.

In another aspect, the invention provides a display device comprising a substrate, a display element disposed on the substrate, and a package covering the display element. The display device further comprises a second substance disposed on at least a part of the substrate inside the package, the second substance comprising a product of the thermite reaction.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF NUMERICAL REFERENCES 01, 1—display device, 10—substrate, 20—display element, 30, 30a, 30b—package, 40—oxygen and water vapor, 50, 50'—first substance, 60—initiating agent, 70—second substance.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
FIG. 1 schematically illustrates a configuration of a conventional display device.
Figure 2:
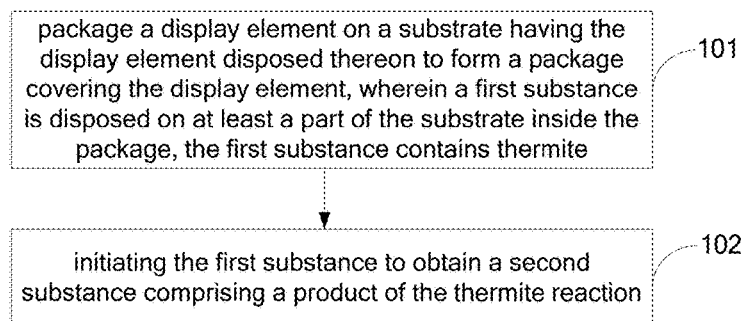
FIG. 2 illustrates a flow chart of a packaging method in accordance with an embodiment of the invention.

An embodiment of the invention provides a packaging method as illustrated in FIG. 2, which comprises:

Step 101: package a display element on a substrate having the display element disposed thereon to form a package covering the display element, wherein a first substance is disposed on at least a part of the substrate inside the package, the first substance contains thermite.

Figure 8:
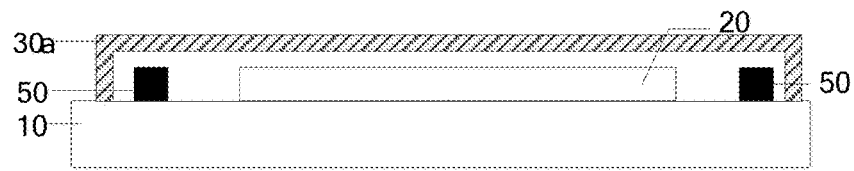
FIG. 8 schematically illustrates a configuration of a display device, where a first substance is positioned between a joining edge between a lid-like package and a substrate and an edge of a display element, in accordance with an embodiment of the invention.
Figure 9:
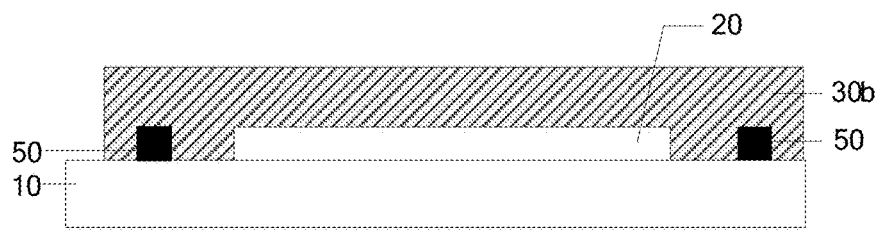
FIG. 9 schematically illustrates a configuration of a display device, where a first substance is positioned in an area where a laminar package contacts a substrate, in accordance with an embodiment of the invention.
Figure 10:
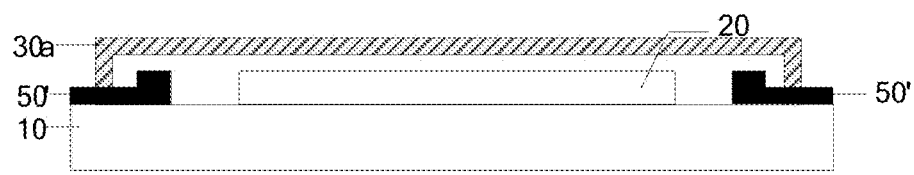
FIG. 10 schematically illustrates a configuration of a display device, where a first substance extends to the exterior of a lid-like package, in accordance with an embodiment of the invention.

For example, when the package is a lid-like package, the first substance may be disposed between a joining edge between the package and the substrate and an edge of the display element (as shown in FIG. 8). When the package is a lamina, the first substance is positioned in an area where the laminar package contacts the substrate (as illustrated in FIG. 9). Furthermore, the first substance is separated from an edge of the display element; that is, there is a distance between the first substance and the edge of the display element. Herein, the "distance" is set according to an amount of the thermite in the first substance and as not influencing the display element, which will not be limited here. Moreover, a shape of the first substance on the substrate will not be limited in the embodiment of the invention. Preferably, a part of the first substance may extend to the exterior of the package (as shown in FIG. 10), such that the first substance is exposed to facilitate the initiation of the thermite in the first substance.

Figure 11:
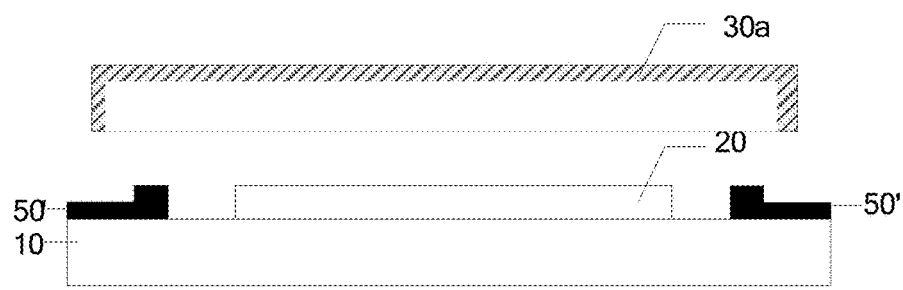
FIG. 11 schematically illustrates a configuration of forming a first substance on a substrate before packaging in accordance with an embodiment of the invention.

As an example, the method may further comprise: disposing the first substance on the substrate around the display element, before packaging the display element (as shown in FIG. 11).

Figure 12:
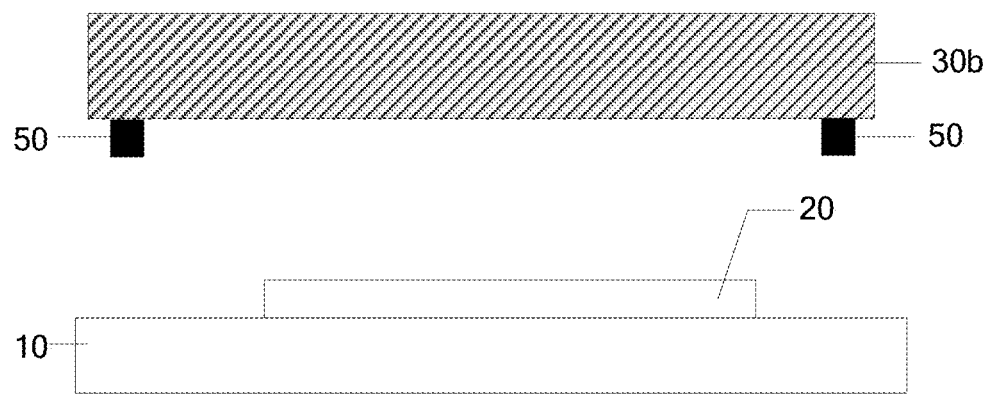
FIG. 12 schematically illustrates a configuration of forming a first substance on a package before packaging in accordance with an embodiment of the invention.

As another example, the method may further comprise: applying the first substance to a side of the package that faces the display element, before packaging the display element (as shown in FIG. 12).

The thermite in the first substance may be a mixture of aluminium powder and Iron (III) oxide ($Fe_2O_3$), or a mixture of aluminium powder and Iron (II, III) oxide ($Fe_3O_4$), or a mixture of aluminium powder and Manganese (III) oxide ($Mn_2O_3$).

As the thermal effect of the thermite is quite intense, the first substance may further comprise inorganic oxides, or inorganic nitrides, or a mixture of both, which does not participate in the thermite reaction and is a solid at room temperature, so as to reduce the intensity of the thermite reaction and to insulate oxygen and water vapor.

The inorganic oxide may for example be aluminum oxide powder ($Al_2O_3$), silicon dioxide powder ($SiO_2$), iron(III) oxide powder ($Fe_2O_3$), iron(II,III) oxide ($Fe_3O_4$), manganese(IV) oxide ($MnO_2$), titanium dioxide ($TiO_2$), zirconium dioxide ($ZrO_2$) or a mixture of at least two of the above substances. The inorganic nitride may be for example silicon nitride. The first substance may further comprise a mixture of any of the above inorganic oxides and inorganic nitrides.

The substrate is for example made of glass, metal, plastic or a combination of two or more of the above. The package is for example made of plastic, glass, composite plastic or combination of two or more of the above.

Please note that the display element according to the embodiment of the invention refers to the element for realizing the display function. Furthermore, the display element may realize the display function together with the substrate. In this case, the substrate is for example an Indium Tin Oxides (ITO) glass substrate.

Specific examples of step 101 are described in the following.

Figure 3A:
FIG. 3a schematically illustrates a configuration having a first substance formed therein in accordance with an embodiment of the invention.

As an example, step 101 may comprise:

Step 1011: as illustrate in FIG. 3a, the first substance 50 and 50' is disposed on the substrate 10 having the display element 20 disposed thereon around the display element 20 and separated by a distance from edges of the display element 20. Please note that shapes of the first substance 50 and 50' are for illustrative purpose only and may be decided according to practical need in real applications.

Figure 3B:
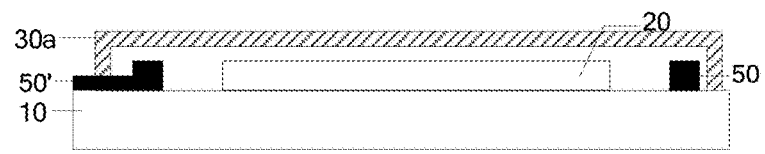
FIG. 3b and FIG. 4 schematically illustrate cross sections of two respective packages in accordance with embodiments of the invention.

Step 1012: as illustrated in FIG. 3b, the display element 20 is packaged to form a lid-like package 30a covering the display element 20. At this point, the first substance 50 is disposed between a joining edge between the package 30a and the substrate 10 and an edge of the display element 20, while a part of the first substance 50' remains in the exterior of the like-like package 30a. The amount and shape of the part of the first substance 50' remaining in the exterior of the package 30 will not be limited here.

Figure 4:
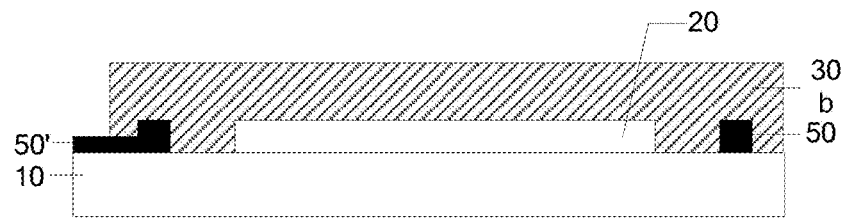

Alternatively, the package may be a laminar package 30b. As illustrated in FIG. 4, the first substance 50 and a part of the first substance 50' are disposed in an area where the substrate and the package contact each other. The rest of the first substance 50' remains in the exterior of the package 30b.

Either of the packaging methods is applicable to the above step 1012, which will not be elaborated here. With the above step, the first substance is not only included at the joining edge between the package and the substrate and the edge of the display element, but also outside the package. By means of the methods, it is convenient to initiate the thermite in the first substance outside the package via an initiator, thereby initiating the thermite inside the package.

Optionally, the method may further comprise the following step before packaging the display element 20: applying a glue to a side of the package 30a or 30b that faces the display element. In this case, the package with the glue applied thereto is attached to the display element 20.

For example, as illustrated in FIG. 12, a glue comprising the first substance 50 is applied to peripheral edges of the side of the package 30b that faces the display element 20 onto which the package 30b will be attached, wherein the glue may be applied to positions separated from the edges of the display element 20 by a distance. Next, the display element 20 is packaged with the package 30b with the glue applied thereto to cover the display element 20. By this means, the first substance 50 is included in the area between the edge joining the substrate 10 and the package 20b and the edges of the display element 20 and separated from the display element 20 by a distance.

Furthermore, as illustrated in FIG. 11, the glue comprising the first substance 50' may also be applied to the substrate 10 having the display element 20 disposed thereon around the display element 20 and separated from the display element 20 by a distance. Thereafter, the display element 20 is packaged to form a package 30a covering the display element 20. Herein, during the packaging, at least a part of the glue comprising the first substance 50' may be kept outside the package 30a. Alternatively, all the glue is covered by the package.

In consideration of the size of the display device, a width of the first substance is for example 0.5 mm.

In the example, the first substance 50, 50' is mixed into the glue. As an example, the glue is a mixture of the first substance and an adhesive agent with a composition ratio of 4:1 to 9:1.

Herein, when the glue contains the first substance, the first substance is disposed on at least a part of the substrate inside the package by coating, and a width of the first substance is the width of the glue.

Still referring to FIG. 2, the packaging method according to the embodiment of the invention further comprises:

Step 102: initiating the first substance to obtain a second substance comprising a product of the thermite reaction.

For example, the first substance comprising the thermite may be initiated to start the thermite reaction via ignition or thermal effect.

Initiating the thermite reaction of the substance comprising the thermite via ignition may be the case when the thermite is positioned in the exterior of the package, the thermite outside the package is initiated by ignition.

Figure 5:
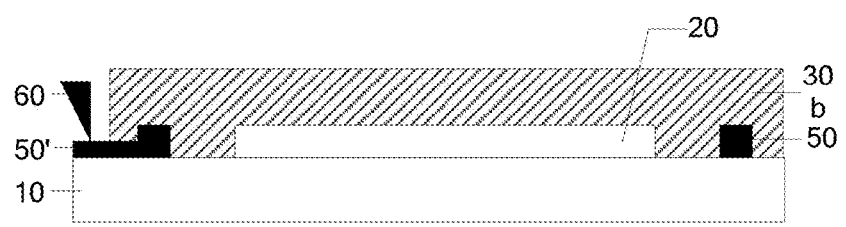
FIG. 5 schematically illustrates a cross section of the display device in a packaging method that initiates a first substance to react in accordance with an embodiment of the invention.

For example, as illustrated in FIG. 5, an initiator 60 placed outside the package 30b and in contact with the first substance 50' may be ignited, heat produced by the burning of the initiator 60 first initiates the thermite in the first substance 50' external to the package and then initiates the thermite inside the package to start the thermite reaction. The initiator may be concentrated sulfuric acid (98%, $H_2SO_4$), magnesium powder, or a mixture of hydrogen peroxide ($H_2O_2$), potassium chlorate ($KClO_3$) and aluminum powder, and so on.

Initiating the thermite to start the thermite reaction by thermal effect may be the case when the first substance 50 comprising the thermite is completely covered (as illustrated in FIGS. 8 and 9) by the package 30a, 30b, that is, there is no first substance outside the package 30a, 30b. In this case, the thermite in the first substance 50 inside the package may be initiated to start the thermite reaction by the thermal effect.

As an example, laser heating may be used to initiate the thermite in the first substance 50 between the edge joining the substrate 10 and the package 30a and the edge of the display element as illustrated in FIG. 8, and initiate the thermite in the first substance 50 in the contact area between the substrate 10 and the package 30b as illustrated in FIG. 9, to start the thermite reaction.

Please note that initiating the thermite to start the thermite reaction is not only applicable to the above situation but also to the case of having the thermite outside the package. However, a preferably initiating method for the thermite outside the package is by way of ignition.

Moreover, in the case that the first substance further comprises inorganic oxides, inorganic nitrides or a mixture of both which does not participate in the thermite reaction and is a solid at room temperature, the second substance comprises the products of the thermite reaction as well as the above substances.

Figure 6:
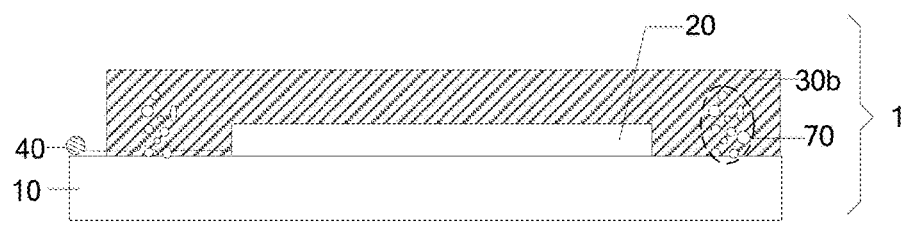
FIG. 6 schematically illustrates isolating oxygen and water vapor by a display device fabricated by a packaging method in accordance with an embodiment of the invention.

In the above step 102, the thermite reaction releases a large amount of heat, which will melt the substrate and the package close to the thermite. Meanwhile, the second substance will be spread into the material of the substrate and/or the package close to the thermite, thereby obtaining the display device 1 as illustrated in FIG. 6.

When oxygen and water vapor 40 external to the display device 1 get into the interior of the display device 1 via a side, that is, an interface between the package 30b and the substrate 10, of the display device 1, the blockage by the second substance 70 dispersed in the display device 1 makes it impossible for oxygen and water vapor 40 to reach the display element 40 following a direct path. Instead, oxygen and water vapor 40 have to circumvent the dispersed second substance 70. It thus prolongs the time needed for oxygen and water vapor 40 to reach the display element 20. If the first substance further comprises inorganic oxides such as aluminum oxide or silicon dioxide which have excellent hygroscopic property, it can further prevent water vapor from entering the packaged device, thereby increasing the lifetime of the display device 1.

An embodiment of the invention also provides a display device comprising: a substrate, a display element disposed on the substrate and a package covering the display element. The display device further comprises: a second substance disposed on at least a part of the substrate inside the package, the second substance comprising a product of the thermite reaction.

Figure 7:
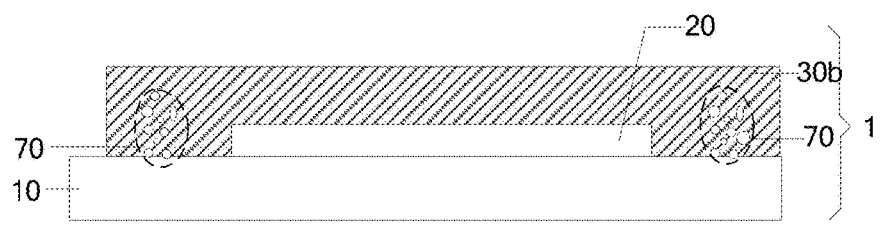
FIG. 7 schematically illustrates a configuration of a display device in accordance with an embodiment of the invention.

For example, as illustrated in FIG. 7, the display device 1 comprises: a substrate 10, a display element 20 disposed on the substrate 10 and a package 30b covering the display element 20. The display device 1 further comprises a second substance 70 disposed at a region where the substrate 10 contacts the laminar package 30b, wherein the second substance 70 comprises a product of the thermite reaction.

Alternatively, the second substance may also be disposed between a joining edge between the lid-like package and the substrate and an edge of the display element and separated from the display element by a distance.

To prevent the second substance 70 from affecting the display and other functions of the display device 1, the second substance 70 is separated from the edge of the display element 10 by at least about 1 mm.

The second substance may further comprises inorganic oxides, or inorganic nitrides, or a mixture of both, which does not participate in the thermite reaction and is a solid at room temperature. Examples of the inorganic oxides and inorganic nitrides are same to those in the previous embodiment.

In the display device according to the embodiment of the invention, as the second substance is dispersed within the material of the substrate and/or the package, when oxygen and water vapor external to the display device get into the interior of the display device via a side of the display device, the blockage by the second substance makes it impossible for oxygen and water vapor to reach the display element following a direct path. Instead, oxygen and water vapor have to circumvent the dispersed second substance. It thus prolongs the time needed for oxygen and water vapor to reach the display element and in turn increasing the lifetime of the display device.

What are described above is related to the illustrative embodiments of the disclosure only and not limitative to the scope of the disclosure; the scopes of the disclosure are defined by the accompanying claims.

What is claimed is:

1. A display device comprising:
   a substrate;
   a display element, disposed on the substrate;
   a package covering the display element; and
   a substance disposed on at least a part of the substrate inside the package, the substance comprising a product of thermite reaction,
   wherein the package is in a lid shape and is in direct contact with the substrate to form a contact area, and the substance is disposed in a gap between the contact area and the display element.

2. The display device of claim 1, wherein the substance is disposed in an area where the substrate contacts the package.

3. The display device of claim 1, wherein the substance is disposed between a joining edge between the substrate and the package and an edge of the display element.

4. The display device of claim 1, wherein the substance is separated from the display element.

5. The display device of claim 1, wherein the substance further comprises inorganic oxides, inorganic nitrides or a mixture of both.

6. A display device comprising:
a substrate;
a display element, disposed on the substrate;
a package in a shape of a lid, covering the display element; and
a first substance, disposed on at least a part of the substrate inside the package, the first substance comprising thermite;
wherein the first substance is configured to be initiated to start a thermite reaction so as to obtain a second substance comprising a product of the thermite reaction,
wherein the package is in direct contact with the substrate to form a contact area, and the first substance is disposed in a gap between the contact area and the display element.

7. The display device of claim 6, wherein the first substance is separated from the display element.

8. The display device of claim 6, wherein the first substance is disposed between a joining edge between the substrate and the package and an edge of the display element.

9. The display device of claim 6, wherein the first substance is disposed in an area where the substrate contacts the package.

10. The display device of claim 6, wherein a part of the first substance extends to the exterior of the package and becomes exposed.

11. The display device of claim 6, wherein the first substance is included in a glue.

12. The display device of claim 6, wherein the first substance further comprises inorganic oxides, inorganic nitrides or a mixture of both.

13. The display device of claim 6, wherein the second substance is disposed in an area where the substrate contacts the package.

14. The display device of claim 6, wherein the second substance is disposed between a joining edge between the substrate and the package and an edge of the display element.

15. The display device of claim 6, wherein the second substance is separated from the display element.

16. The display device of claim 6, wherein the second substance further comprises inorganic oxides, inorganic nitrides or a mixture of both.

17. The display device of claim 6, wherein the package is in direct contact with the substrate to form a contact area, and the second substance is disposed in a gap between the contact area and the display element.

* * * * *